United States Patent
Marokkey et al.

(10) Patent No.: US 8,330,937 B2
(45) Date of Patent: *Dec. 11, 2012

(54) STRAY LIGHT FEEDBACK FOR DOSE CONTROL IN SEMICONDUCTOR LITHOGRAPHY SYSTEMS

(75) Inventors: Sajan Marokkey, Wappingers Falls, NY (US); Wai-Kin Li, Poughkeepsie, NY (US); Todd C. Bailey, Fishkill, NY (US)

(73) Assignees: Infineon Technologies AG, Neubiberg (DE); International Business Machines Corporation, Armonk, NY (US)

( * ) Notice: Subject to any disclaimer, the term of this patent is extended or adjusted under 35 U.S.C. 154(b) by 604 days.

This patent is subject to a terminal disclaimer.

(21) Appl. No.: 12/511,883

(22) Filed: Jul. 29, 2009

(65) Prior Publication Data
US 2009/0284726 A1    Nov. 19, 2009

Related U.S. Application Data

(62) Division of application No. 10/995,714, filed on Nov. 23, 2004, now Pat. No. 7,583,362.

(51) Int. Cl.
*G03B 27/54* (2006.01)
*G03B 27/52* (2006.01)
*G01N 21/00* (2006.01)

(52) U.S. Cl. .......... 355/69; 355/30; 356/239.2
(58) Field of Classification Search ........ 355/30, 355/53, 69, 77; 430/30; 700/121; 356/239.2
See application file for complete search history.

(56) References Cited

U.S. PATENT DOCUMENTS

| | | | |
|---|---|---|---|
| 5,097,291 A * | 3/1992 | Suzuki | 355/69 |
| 5,656,182 A | 8/1997 | Marchman et al. | |
| 6,078,381 A | 6/2000 | Suzuki | |
| 6,285,442 B1 | 9/2001 | Sato | |
| 6,803,991 B2 | 10/2004 | Mori | |
| 6,929,892 B2 | 8/2005 | Shishido et al. | |
| 7,277,165 B2 | 10/2007 | Wu et al. | |
| 2003/0063266 A1* | 4/2003 | Leenders et al. | 355/53 |
| 2003/0068565 A1* | 4/2003 | Ki et al. | 430/5 |
| 2003/0147060 A1* | 8/2003 | Tokuda et al. | 355/53 |
| 2004/0029022 A1* | 2/2004 | Farrar | 430/5 |
| 2005/0052651 A1* | 3/2005 | Kim | 356/433 |
| 2005/0275820 A1* | 12/2005 | Fukuhara et al. | 355/69 |

OTHER PUBLICATIONS

Adams, T. E., "Applications of Latent Image Metrology in Microlithography", SPIE vol. 1464, Integrated Circuit Metrology, Inspection, and Process Control V, 1991, pp. 294-312, AT&T Bell Laboratories, Allentown, Pa. 18103.

Vorwerk, M., et al., "ArF Scanner Evaluation," Future Fab International, downloaded Nov. 8, 2004, pp. 1-10, http://www.future-fab.com/document.asp?d_id=1661, Montgomery Research Inc., San Francisco, CA.

* cited by examiner

*Primary Examiner* — Toan Ton
*Assistant Examiner* — Steven H Whitesell Gordon
(74) *Attorney, Agent, or Firm* — Slater & Matsil, L.L.P.

(57) ABSTRACT

A lithography system with a stray light feedback system is disclosed. The stray light feedback helps control critical dimension (CD) within a stray light specification limit. A stray light dose control factor is calculated as a function of the stray light measured in the exposure tool and the sensitivity of the resist. The stray light dose control factor is used to adjust the exposure dose to achieve the desired CD. The stray light may be monitored, and if a threshold level of stray light is reached or exceeded, the use of the exposure tool may be discontinued for a particular type of semiconductor product, resist, or mask level, until the lens system is cleaned.

18 Claims, 3 Drawing Sheets

STRAY LIGHT FEEDBACK FOR DOSE CONTROL IN SEMICONDUCTOR LITHOGRAPHY SYSTEMS

This is a divisional application of U.S. application Ser. No. 10/995,714, which was filed on Nov. 23, 2004 now U.S. Pat. No. 7,583,362 and is incorporated herein by reference.

TECHNICAL FIELD

The present invention relates generally to the manufacturing of semiconductor devices, and more particularly to lithography systems for semiconductor devices.

BACKGROUND

Generally, semiconductor devices are fabricated by depositing a plurality of insulating, conductive, and semiconductive material layers over a substrate or workpiece, and patterning the various material layers to form integrated circuits and electronic elements thereon. The conductive, semiconductive, and insulating material layers are patterned and etched to form integrated circuits (ICs).

To pattern a material layer, the material layer is deposited or formed over the workpiece or previously deposited material layers, and a layer of resist is deposited over the material layer. A pattern for the material layer is transferred to the layer of resist using lithography. For example, a photomask is typically used to image a master pattern onto the resist, by exposing the resist to light or energy through or reflected from a photomask. The resist is then developed, and the material layer is etched using the layer of resist as a mask. The resist is then removed, and additional material layers are deposited and patterned in a similar fashion. There may be a dozen or more lithography photomask levels required to manufacture an integrated circuit, for example.

As semiconductor devices decrease in size, as is the trend in the industry, patterning the various material layers becomes more difficult. As features become smaller, the wavelength used to develop the resist is decreased. For example, resists that develop at 193 nm are now being used, which provides a common Depth Of Focus (DOF) of less than 250 nm. The exposure latitude of a 193 nm resist is about 5%; thus, for most lithography processes, centering the dose and focus close to the optimum settings is desired, for critical dimension (CD) control and in order to reduce the number of reworks required and improve fabrication productivity.

Scanners are used in semiconductor device manufacturing to expose resist layers. A portion of a workpiece is typically exposed at a time, and the scanner steps from one portion of the workpiece to the next, repeating the process until the entire workpiece is exposed.

FIG. 1 illustrates a prior art lithography exposure tool or scanner 100. A workpiece 102 comprising a semiconductor wafer, for example, is placed on a support 104. Light, e.g., 193 nm laser light supplied by a light source 106, is directed through lenses 105 to a mirror 107 and is reflected to a lithography mask 108, through a lens system 110 towards the workpiece 102. The lens system 110 comprises a projection lens column having an array of a plurality of lenses 111 and 120 inside. There may be twenty or more lenses 111 and 120 disposed inside the lens system 110, for example. The workpiece 102 is moved in a first direction 112 and the mask 108 is moved in a second direction 114, the second direction 114 being opposite from the first direction 112. When the workpiece 102 is exposed to the projected light, an image of the mask 108 is formed on a resist layer on the workpiece 102.

If there is contamination on one or more lenses 111/120 of the lens system 110, light may scatter from the contaminated areas, referred to as stray light or scattered light. Stray light can be directed in any direction because it is not controlled by the lens system 110, for example.

Some semiconductor products are not very sensitive to stray light, such as 90 nm technologies or greater, e.g., having minimum feature size of about 120 nm and a pitch of about 240 nm. However, other semiconductor products are more sensitive to stray light, e.g., semiconductor products having an extremely small minimum feature size. In particular, in 65 nm technology and below, e.g., semiconductor devices having minimum feature sizes of 65 nm or less and a pitch of about 180 nm or less, are particularly sensitive to stray light.

If there is stray light present during the lithography process, the patterning of the workpiece 102 can be deleteriously affected. Stray light can destroy the pattern at a particular periodicity, for example. If there is a large amount of stray light in a lithography tool such as scanner 100 shown, the tool must be shut down so that the lens system 110 can be cleaned, requiring some production down time. The scanner 100 needs to be re-qualified after cleaning the lens 110, which may take a day, for example. Although contamination of the lens system 110 causes stray light, it is typically not practical to clean the projection lens or lens system 110 on a frequent basis to reduce stray light, because of the down time and loss of use of the production tool 100. Therefore, tool 100 vendors typically recommend that an upper specification limit of stray light be reached before the tool 100 is shut down to clean the lens system 110. The upper specification limit recommended is typically about 5%.

As stray light increases, a lower exposure dose is required to print a feature. Stray light illuminates regions on a wafer where illumination is not desired. Stray light affects CD control. It is common for stray light to be present in 193 nm and 248 nm lithography tools, for example, arising from lens contamination in the path of light, causing scattered light.

In a production line there are many chemicals used in a fabrication facility that can contaminate the lens system 110. Contamination sources include gases, evaporating chemicals, organic materials emitting from the resist material. Other contamination sources include photo-induced deposition and particles in the equipment environment, as examples. Effects of stray light include a dose reduction for target CD, and unlike "hard" contaminations, such as large chunks of dust, stray light can result in a severe degradation of through pitch uniformity and a degradation of CD uniformity.

ArF scanners have been used as lithography exposure tools for a few years. ArF scanners utilize calcium fluoride optical elements and ArF laser light sources. ArF scanners allow better resolution and smaller targets without applying aggressive resolution enhancement or double exposure techniques. However, stray light can be a problem in ArF scanners, because of the calcium fluoride optics material, coatings, and the shorter wavelength used, which generate more stray light than prior art KrF scanners and other types of scanners, for example.

Thus, stray light is an issue that needs to be addressed in semiconductor lithography equipment.

SUMMARY OF THE INVENTION

These and other problems are generally solved or circumvented, and technical advantages are generally achieved, by preferred embodiments of the present invention, which provide novel systems and methods of monitoring stray light and feeding the monitored stray light data back into the production control system.

The additional stray light measurement data is fed back to control CD specification. The stray light feedback can be set up to occur periodically, e.g., once a week, for example, on fully utilized production tools.

In accordance with a preferred embodiment of the present invention, a method of lithography includes providing a workpiece, the workpiece having a layer of resist disposed thereon, the resist having a resist sensitivity factor. An exposure tool is provided, the exposure tool comprising a lens system and being adapted to expose the layer of resist at an exposure dose. The method includes measuring the amount of stray light of the lens system of the exposure tool, determining a stray light dose control factor as a function of at least the amount of stray light, adjusting the exposure dose by the stray light dose control factor, and exposing the resist layer on the workpiece with the adjusted dose.

In accordance with another preferred embodiment of the present invention, a method of adjusting an exposure dose of a lithography system includes providing a first exposure tool, the first exposure tool comprising an exposure dose, measuring stray light in the first exposure tool, and providing a resist sensitivity factor of a resist. The method includes calculating a dose control factor as a function of the measured stray light and the resist sensitivity factor, and adjusting the exposure dose by the dose control factor.

In accordance with yet another preferred embodiment of the present invention, a lithography system includes a lens system and a support for a semiconductor workpiece proximate the lens system. The workpiece has a resist disposed thereon, and the resist comprises a resist sensitivity factor. The system includes an exposure tool proximate the lens system, the exposure tool including a light source adapted to expose the resist on the semiconductor workpiece at an exposure dose, memory for storing a measurement of stray light of the lens system and the resist sensitivity factor of the resist, and a processor for determining a stray light dose adjustment factor of the exposure tool as a function of at least the measurement of stray light, and for adjusting the exposure dose used to expose the resist of the workpiece by the stray light dose adjustment factor.

In accordance with another preferred embodiment of the present invention, a lithography system includes an exposure tool, a means of monitoring stray light within the exposure tool, and a control system for controlling the exposure dose of the exposure tool. A measurement of monitored stray light is fed back to the control system and is used to adjust the exposure dose of the exposure tool.

Advantages of embodiments of the present invention include a reduction in the number of reworks for semiconductor devices. The method is easily implementable in a feedback system of a specific lithography tool or in a fabrication facility, for example. The stray light information in the feedback system may be used to selectively shut down the lithography of specific semiconductor devices, resists, or material layers on a particular tool. Scanners with a large amount of stray light, e.g., above a predetermined threshold level, may be used to fabricate semiconductor devices that are less sensitive to stray light, while scanners with stray light measured below the threshold level may be used to fabricate semiconductor devices sensitive to stray light, for example. One or more threshold levels of stray light may be set.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

Figure 1:
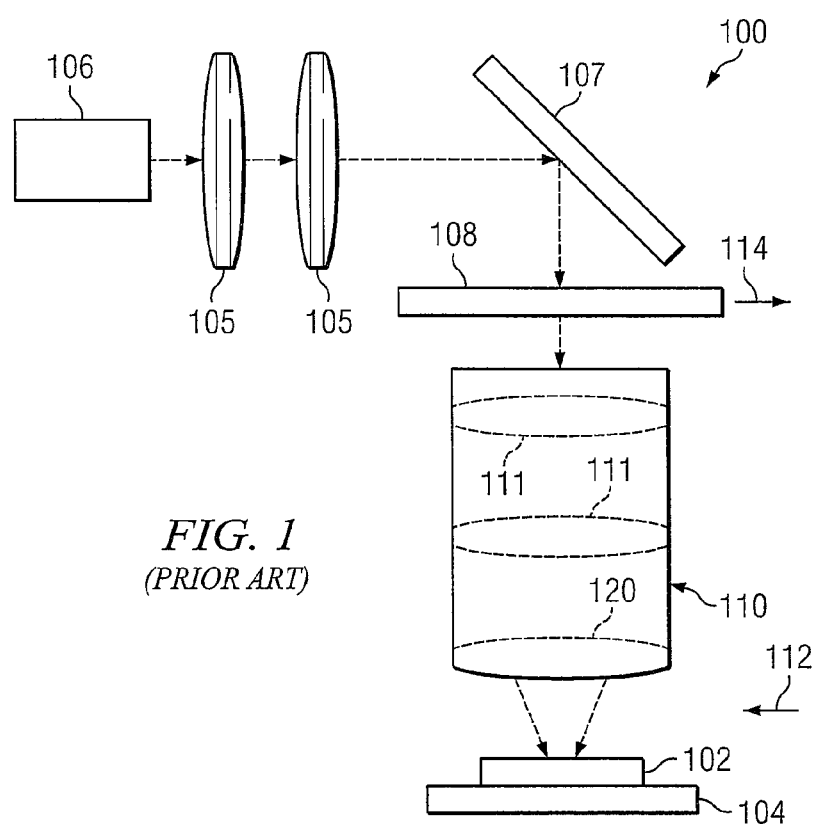
FIG. 1 shows a cross-sectional view of a prior art lithography system.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a stray light feedback system and method for an exposure tool of a semiconductor device using transmissive lithography masks. The invention may also be applied, however, to other exposure tools used in other industries, and to exposure tools used with reflective lithography masks of semiconductor devices, as examples.

In many semiconductor device facilities, stray light is measured on a lithography exposure tool relatively infrequently, e.g., about once or twice a month, for example. A method referred to as the Kirk method is often used to measure stray light, as an example. A stray light test mask having a large opaque region is measured, using a light sensor, for example, and the amount of stray light that passes by even in the presence of the large opaque region is a function of the amount of stray light in the exposure tool. If the stray light measured is less than about 5%, the exposure tool is continued to be used as usual for the patterning of semiconductor devices.

However, with the use of ArF scanners and semiconductor devices having smaller CDs, about 2.5% or greater stray light is an excessive amount of stray light in some applications. This results in a large number of semiconductor devices requiring re-works, which is time-consuming and costly. Thus, the current methods of monitoring stray light and the thresholds of acceptable stray light are unacceptable for the production of some semiconductor devices.

If the stray light exceeds 5%, to reduce the stray light in a lithography tool, the lithography tool is shut down for a day or more, and the lens system is cleaned. The lens system may include twenty or more lenses contained in a controlled chamber, although only one or two lenses are exposed to the ambient environment of the exposure tool. However, the lenses sealed in the lens system may be contaminated by films or particles, even in a sealed lens system. Typically, when the lens system is cleaned, the two outer-most lenses of the lens system are cleaned. The lens systems used in lithography tools are typically quite costly, e.g., and may comprise multi-million dollar lens systems, for example. After the lens system is cleaned, the lithography tool must be requalified. Because production is stopped for a day or more when a lithography tool lens cleaning is required, the number of lens cleanings is typically kept to a minimum. In most production facilities, each lithography tool is cleaned about once a year, e.g., during a yearly maintenance, requiring a down time of about 2 to 3 days, for example.

Embodiments of the present invention achieve technical advantages by feeding back stray light information to a lithography exposure system so that a decision can be made to shut down production of particular semiconductor devices, mask levels, or resist types if the stray light percentage is too large. Until the exposure tool is cleaned to reduce the stray light, products sensitive to stray light are not processed on that particular exposure tool. Adjustments for stray light may be made in lithography tools on a real time basis in accordance with embodiments of the present invention. The lithography tools in a production facility may be categorized by the amount of stray light, and semiconductor devices more sensitive to stray light may be processed on the lithography tools having the lowest amount of stray light, for example.

Figure 2:
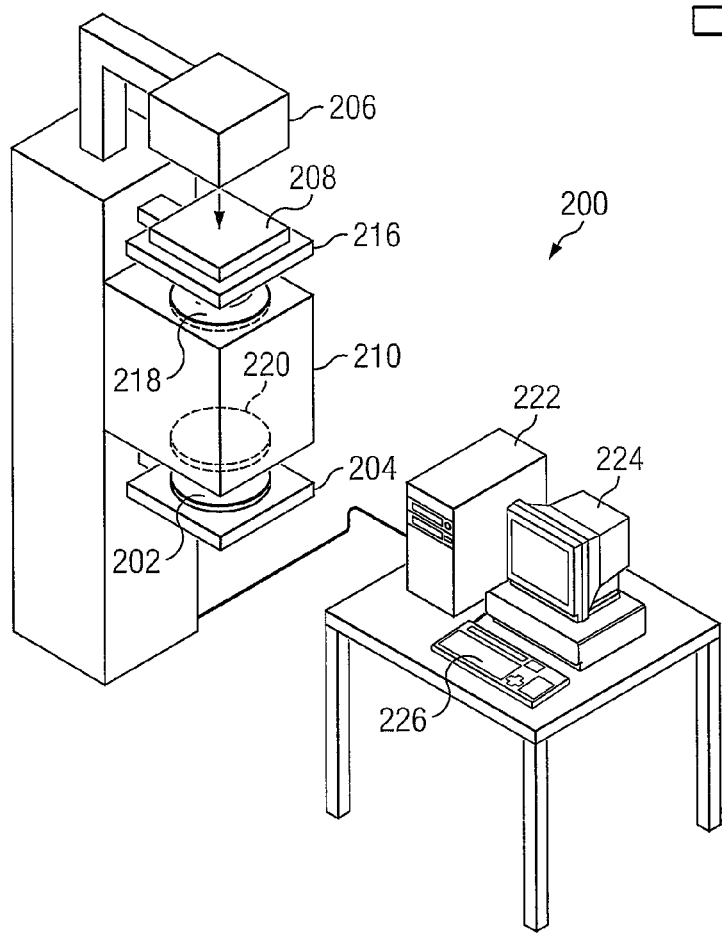
FIG. 2 shows a perspective view of a lithography system or exposure tool in accordance with an embodiment of the present invention.

FIG. 2 shows a perspective view of a lithography system or exposure tool 200 in which embodiments of the present invention may be implemented. Like numerals are used in FIG. 2 as were used in FIG. 1; e.g., numerals x02, x04, etc. represent similar elements in FIGS. 1 and 2, with x=1 in FIG. 1 and x=2 in FIG. 2, for example.

The exposure tool 200 includes a light source 206 and a lens system 210 disposed between a support 204 for a semiconductor workpiece or wafer 202 and the light source 206. The workpiece 202 may have a layer of resist or photoresist disposed thereon (not shown). A mask 208 and support 216 are disposed between the light source 206 and the lens system 210, as shown. The lens system 210 comprises an array of internal lenses (not shown), and includes two exposed lenses 218 and 220, as shown. One lens 218 is proximate the mask 208 and the other lens 220 is proximate the workpiece 202. The light source 206, lens system 210, mask 208 and wafer 202 may be enclosed in a chamber (not shown) so that the temperature and ambient gases may be controlled during the fabrication process. The lens system 210 may be mounted vertically and may be placed away from the wafer 202 by about 5 mm, for example.

Figure 3:
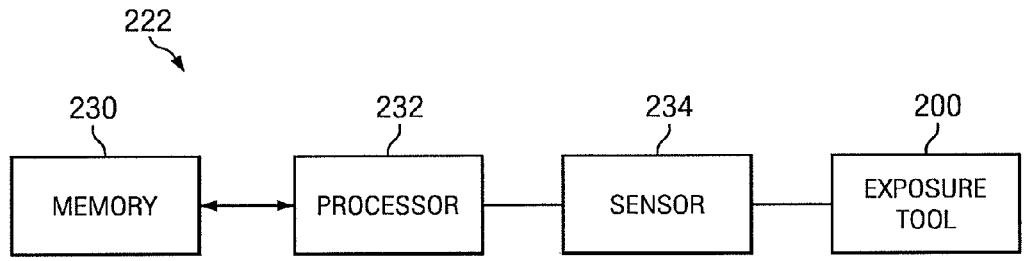
FIG. 3 is a block diagram of the control system shown in FIG. 2.

The exposure tool 200 includes a control system 222 that may comprise a computer, for example, and an operator console comprising a monitor 224 and a keyboard 226, as shown. Rather than a keyboard, the operator console may comprise a combination of screens and/or buttons, levels or knobs, not shown. FIG. 3 is a block diagram of the control system 222 shown in FIG. 2. The control system 222 includes a memory 230 for storing a plurality of processing parameters for the exposure tool 200, and a processor 232 for performing calculations and analyses on the parameters and measurements made by other elements of the tool 200. Moreover, the block diagram 222 comprises a light sensor 234 and the exposure tool 200. For example, light sensor 234 measures the stray light in the exposure tool 200 and provides the measured information to the processor 232.

An exposure dose is the amount of energy or light that is directed towards a workpiece 202 during an exposure. The exposure dose is controllable to a specified limit. In accordance with an embodiment of the invention, depending on the amount of stray light measured in the exposure tool 200 by the light sensor 234, the exposure dose can be controlled below the limit to bring the semiconductor product into the specification. The stray light measurement is fed back to the control system 222 to adjust the exposure dose of the exposure tool 200 because the stray light is a particular quantity. After the layer of resist on the workpiece 202 is exposed, the resist is developed, and the resist is used as a mask while a material layer beneath the resist is patterned, for example.

Figure 4:
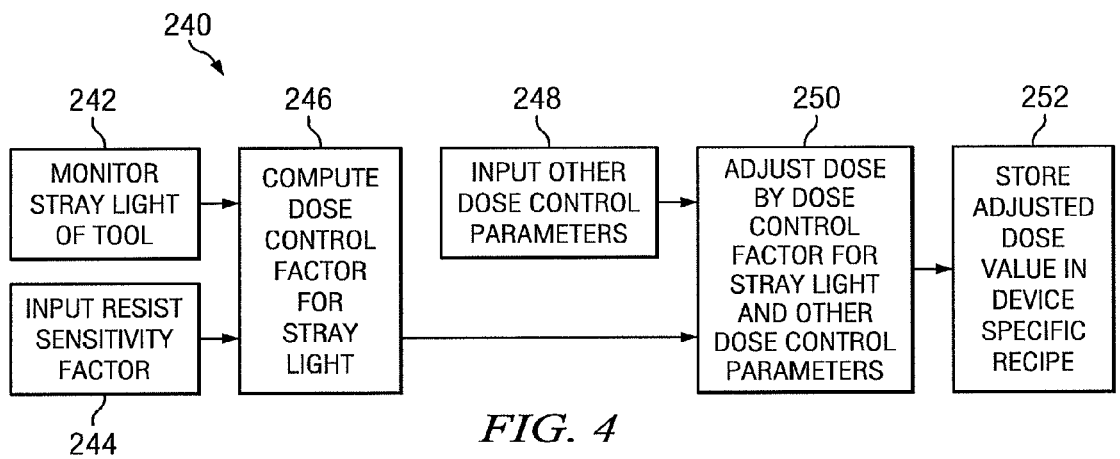
FIG. 4 is a flow chart for a method of the present invention, wherein a stray light dose control factor is calculated as a function of the monitored stray light of a lithography tool and a resist sensitivity factor, and the exposure dose is adjusted by the stray light dose control factor.

FIG. 4 shows a flow chart 240 that illustrates an example of a method of implementing an embodiment the present invention. The flow chart 240 will next be described, with reference also to the exposure tool 200 shown in FIGS. 2 and 3. The stray light of the exposure tool 200 is measured or monitored (step 242). Stray light is typically measured in terms of a percentage. The stray light is measured by completely blocking one area so that no light is expected to pass through the blocked area, e.g., using the Kirk test. If no light passes through the blocked area, then the stray light is 0%. However, if there is stray light in the system, then some light passes by the blocked area, and the stray light percentage increases. Stray light is also referred to in the art as "flare."

The resist sensitivity factor for a resist that will be deposited on the workpiece 202 is input by an operator into the control system 222 (step 244). The resist sensitivity is a function of the particular resist selected. Some resists are more sensitive than others, for example. The resist sensitivity is typically a parameter that is obtained from a manufacturer of the resist when the resist is selected or purchased, for example. The unit of resist sensitivity is typically measured in nm/milliJoules, for example. Resist sensitivity is often referred to in the art as the "dose slope."

Next, a stray light dose control factor (SLDCF) is computed or calculated, based on the resist sensitivity factor and the stray light measured (step 246). The stray light dose control factor is a function of the stray light measured (SL) and the resist sensitivity (RS), as shown in Equation 1:

$$SLDCF = f(SL, RS) \qquad \text{Eq. 1}$$

The stray light dose control factor varies for different types of resists. The stray light dose control factor also varies from one lithography tool 200 to the next. The stray light dose control factor also varies between the particular semiconductor devices that are to be patterned, for example.

In one embodiment, the stray light dose control factor is calculated for each type of resist used on a lithography tool 200.

In another embodiment, the stray light dose control factor is calculated for only one type of resist used on the lithography tool 200. In this embodiment, the type of resist used to calculate the stray light dose control factor is referred to as a reference resist. An equation that may be used to calculate the dose control factor in this embodiment is shown in Equation 2, below:

$$\Delta \text{Dose} = \left\{ \begin{array}{c} SS(\text{reference resist}) * \\ \% \text{ stray light} \\ (\text{reference resist}) \end{array} \right\} * \frac{DS(\text{reference resist})}{DS(\text{resistX})}; \quad \text{Eq. 2}$$

where $$DS = \frac{\Delta CD}{\Delta \text{Dose}};$$

$$SS = \frac{\Delta \text{Dose}}{\Delta \% \text{ StrayLight}};$$

wherein DS is the dose slope calculated for a particular material layer and a particular resist at a reference CD, "SS (reference resist)" is the stray light sensitivity of a reference resist at a reference critical dimension (CD), "resist X" comprises a resist that will be used to pattern a material layer on a workpiece, and "% stray light (reference resist)" comprises the stray light measured for the reference resist. The SS is measured only for the reference resist and is generic for a particular material layer, e.g., for a metal level or a via level.

The DS is the resist sensitivity factor that is calculated for a resist and is also used in day-to-day dose feedback control. DS (reference resist) in Equation 2 is the DS that is calculated for the reference resist. DS (resistX) is the DS that is calculated for the resist that will be used to pattern a material layer on a workpiece. If the reference resist is the type of resist that will be used to pattern a material layer on a workpiece, then $$\frac{DS(\text{reference resist})}{DS(\text{resistX})} = 1,$$

and this term does not influence the result of the equation.

Therefore, combining two pieces of information, namely the resist sensitivity and the stray light, a stray light dose control factor is determined. The stray light dose control factor calculated represents the amount the dose is adjusted to accommodate the presence of stray light in the exposure tool.

Next, the exposure dose of the exposure tool 200 is adjusted by the stray light dose control factor (step 250), e.g., by the processor 232 of the control system 222. Other dose control parameters or factors may also be input to the tool 200 (step 248). One example of other dose control factors includes a statistical feedback parameter such as the dose used for previous lots. Another example of other dose control factors is a matching parameter. For example, if there is more than one lithography tool in a production facility, the doses of the lithography tools may be matched with a matching parameter. The matching parameter may comprise a calibration factor for a plurality of lithography tools, for example. Other dose control factors may also be used to adjust the exposure dose, for example.

After the exposure dose is adjusted, the value of adjusted dose is stored in a device specific recipe (step 252), e.g., in the memory 230 of the control system 222. A plurality of adjusted dose values may be stored in the memory 230 of the control system 222, for example.

There are typically several types of resists used with a single lithography tool. For example, there may be 2 to 6 different types of resists used with one lithography tool. Each resist may have a different exposure dose, for example. Thus, a stray light dose control factor for each different type of resist is preferably determined (step 246) and is used to adjust the exposure dose (step 250), in accordance with embodiments of the present invention. Usually a limited number of types of resists, e.g., about 10 or less, are used on one exposure tool, to maintain controllability of the lithography process, for example.

In one embodiment, the stray light dose control factor is determined iteratively. For example, the desired effective dose can be known. For example, a critical dimension (CD) of 90+/−5 nm may be desired. The resist sensitivity is a known value. Different stray light dose control factors may be tried and implemented in a lithography system, to see if the desired CD is achieved, for example. The process may be repeated with different stray light dose control factors until the desired CD and/or CD range is achieved, for example.

The optimum stray light dose control factor may then be stored into the system and used for future exposure of semiconductor devices of that particular type and resist type. In addition, or alternatively, after the exposure dose is adjusted, the adjusted exposure dose may be saved in the memory 230, so that when that particular type of resist and semiconductor device is in the future desired to be processed, the adjusted exposure dose can be retrieved. The particular parameters and settings for a particular semiconductor device product and resist layer are referred to in the art as a "recipe," for example. Thus, the adjusted exposure dose and/or stray light dose control factor may be saved as a parameter of a recipe.

Figure 5:
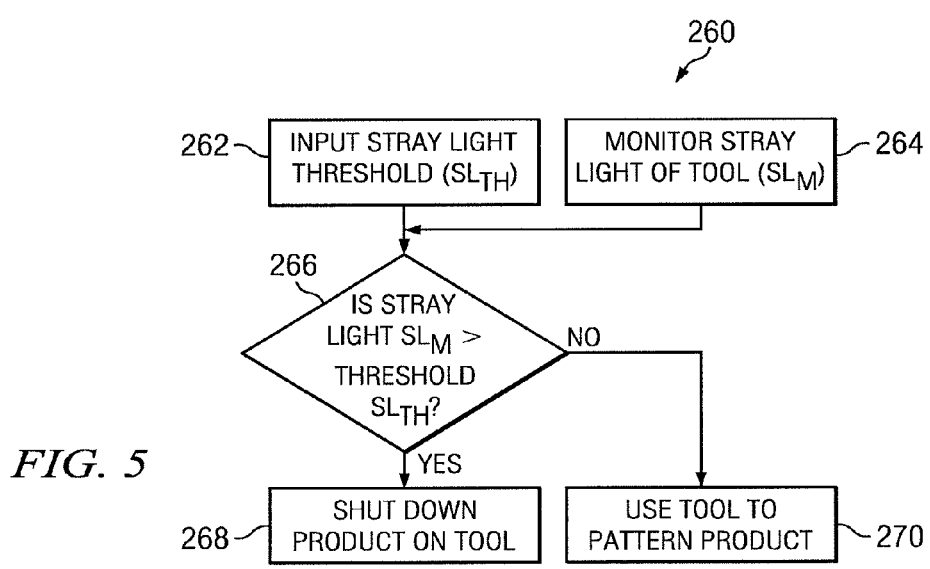
FIG. 5 is a flow chart for a method of determining if a lithography tool should be shut down if a particular stray light threshold is reached or exceeded.

FIG. 5 shows a flow chart 260 for a method of determining if a lithography tool should be shut down if a particular stray light threshold is reached or exceeded. A threshold for stray light ($SL_{TH}$) is input to the control system 222 (e.g., by an operator using the operator console 224/226) and stored in memory 230 (step 262). The stray light ($SL_M$) of the tool 200 is monitored or measured (step 264) and may also be stored in the memory 230 (step 264). The processor 232 queries whether the stray light measured $SL_M$ is greater than the threshold $SL_{TH}$ for stray light (step 266). If $SL_M<SL_{TH}$, the exposure tool 200 is used to pattern the product 202 (step 270). However, if $SL_M>SL_{TH}$, that particular exposure tool 200 is not used to pattern that particular product 202 (step 268). Thus, if a particular stray light threshold level for a resist and particular semiconductor device is reached, the production line can be shut down, to avoid manufacturing a large number of defective products 202, for example. For example, if a stray light of about 2.5% or greater is detected, the exposure of a particular type of resist on semiconductor devices may be discontinued.

The screening with respect to the threshold level for stray light may be inclusive or exclusive of the threshold value $SL_{TH}$, depending on the desired results, for example. For example, if $SL_M \leq SL_{TH}$, the tool 200 may be used to pattern the product 202 (step 270), or if $SL_M \geq SL_{TH}$, that particular exposure tool 200 may not be used to pattern that particular product 202 (step 268).

The flow charts shown in FIGS. 4 and 5 may be used separately or together, in accordance with preferred embodiments of the present invention.

Thus, in accordance with a preferred embodiment of the present invention, if the stray light of an exposure tool 200 is about 1%, that is an acceptable amount, and the exposure dose is adjusted by the stray light dose control factor to accommodate for the stray light. In particular, because the stray light increases the amount of exposure to light by the resist layer on the workpiece 202, the exposure dose is reduced by the amount of the stray light. If there is stray light in the lithography tool 200, reducing the exposure dose increases the likelihood that the pattern will be reproduced from the lithography mask 208 to the resist layer on the workpiece 202 as desired, for example. However, if there is too much stray light in the exposure tool 200, e.g., about 2.5% or greater stray light, the tool 200 is shut down, because patterns transferred would not be reproduced on the resist layer on the workpiece 202 as desired.

In accordance with a preferred embodiment of the present invention, the stray light is monitored periodically, e.g., once a week. However, alternatively, in accordance with embodiments of the present invention, the stray light of an exposure tool 200 may be monitored more or less frequently, for example. The stray light may be monitored on a set time schedule or interval, such as monthly, bimonthly, weekly, bi-weekly, daily, hourly, or after a predetermined number of minutes, for example. The predetermined number of minutes may comprise about 1 minute to about 59 minutes, as examples, although alternatively, the predetermined number of minutes may comprise other time intervals. In some applications, the stray light may be monitored after a predetermined number of lots of workpieces have been processed, or on a lot-by-lot basis, for example. The predetermined number of lots may comprise about 2 to about 100 or 1000, as examples, although alternatively, the predetermined number of lots may comprise other numbers.

In a production facility, typically there are two or more exposure tools. Preferably, in accordance with an embodiment of the present invention, if a first lithography tool is found to have a stray light percentage of about 2.5 or greater, for example, semiconductor devices not sensitive to stray light, e.g., having relatively large minimum feature sizes, e.g., 90 nm or greater, are processed on the first lithography tool. However, semiconductor devices that are sensitive to stray light are not processed on the first lithography tool. Rather, stray light sensitive devices may be processed on a second lithography tool having a stray light percentage of about 2.5 or less, for example. Whether or not a semiconductor device can be processed on a first lithography tool or a second lithography tool may also be a function of the type of resist used, for example.

Embodiments of the present invention may be implemented on existing lithography tools. For example, a software modification may be used to adjust the dose in accordance with the stray light measured in the system, for example. Embodiments of the present invention are preferably manifested in a control system 222 of a lithography tool, for example, as shown in FIG. 2. The resist sensitivity factor of a resist is a variable that is typically already used in a lithography tool. The stray light measured is input and the control system 222 calculates the stray light dose control factor, for example.

The stray light dose control factor of embodiments of the present invention preferably comprises a positive or negative value, for example. The dose is adjusted by the stray light dose control factor, as shown in Eq. 3:

$$\text{adjusted dose} = \text{stray light dose control factor} + (\text{other dose control factors} * D);$$ Eq. 3 where D is the exposure dose for the particular resist being used, for example. In the absence of the other dose control factors, for example, the adjusted dose may be greater than or less than the exposure dose D of the resist, because the stray light dose control factor is negative for increasing stray light, and positive for decreasing stray light.

Figure 6:
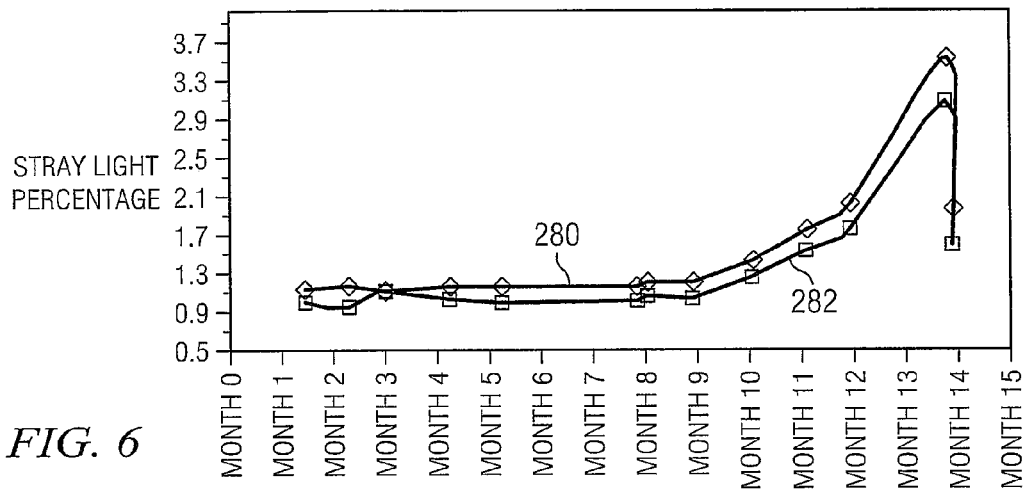
FIG. 6 is a graph illustrating the increase in stray light of a lithography tool over time, wherein the stray light decreases after the lens system is cleaned.

FIG. 6 is a graph showing results from the measurement of stray light in an exposure tool 200, measured using two sizes of opaque blocks. For example, graph 280 indicates the stray light measured by a sensor 234 disposed beneath a 33×33 μm opaque block on a test lithography mask, and graph 282 indicates the stray light measured by a sensor 234 disposed beneath a 108×108 μm opaque block on a test lithography mask. The 33 μm opaque block and the 108 opaque block may be disposed on the same test lithography mask, for example. As shown in FIG. 6, the stray light becomes larger as time goes on. For example, in month 1, the stray light is about 1.0 to 1.1, and in month 14, the stray light is 3.1 and 3.5, respectively. At month 14, defective products were noticed. The lithography system was shut down, and the lens system was cleaned, resulting in a decrease of stray light detected after month 14, as shown.

Stray light presents an unusual problem in that the stray light may not affect the monitored patterns, but it may affect certain parts of an integrated circuit, resulting in poor performance. The performance problems may not be detected by the semiconductor device manufacturer, but may be noticed by the end customer to whom the semiconductor devices are shipped. The semiconductor devices may not work as intended. This can occur because not every semiconductor device is tested before shipping; rather, devices are typically electrically tested on a periodic sampling basis.

Figure 7:
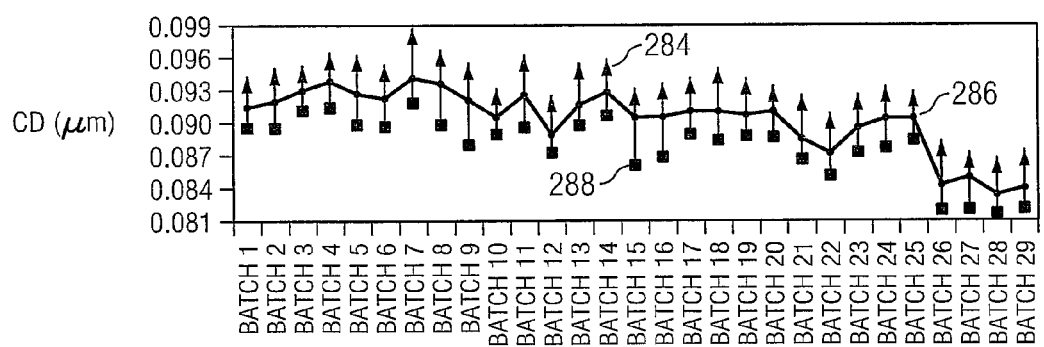
FIG. 7 is a graph illustrating that a decrease in stray light decreases the CD of patterns formed, demonstrating that the dose may be adjusted to achieve the desired CD of a semiconductor device.

FIG. 7 is a graph of critical dimension (CD) versus exposure dose for a semiconductor product for a plurality of batches, e.g., batch 1 through batch 29, wherein the batches occur sequentially over time. The desired CD for the semiconductor product is 90 nm or 0.090 μm. The graph shows a minimum CD for each batch at 288, a maximum CD at 284, and a mean CD 286, for example. Variations in the CD may be caused by variations in the measurement tool as well as stray light in the exposure tool 200, for example. The CD is related to exposure dose in that as the exposure dose is increased, the space formed in the resist increases. For batches 1 through batch 11, an exposure dose of 28 milliJoules/cm$^2$ was used. However, at this exposure dose, the mean CD was often 0.093 μm or greater. Over time, and with additional contamination of the lens system, the stray light continued to increase, so the exposure dose was decreased to 28.5 milliJoules/cm$^{12}$. After batch 25 was run, the lens system 210 of the exposure tool 200 (see FIG. 2) was cleaned, resulting in a reduction in the stray light, causing a decrease in CD to a mean of about 0.084 μm, as shown in batch 26 through batch 29. After batch 29, to achieve a mean CD of about 0.090 μm, the exposure dose was increased to 29.5 milliJoules/cm$^2$, not shown in the graph.

Thus, after a lens system 210 of an exposure tool 200 is cleaned, in accordance with an embodiment of the invention, the stray light is measured again and the exposure dose is adjusted. Adjusting the exposure dose after a lens system 210 cleaning typically requires an increase in the exposure dose, because the stray light is reduced after a lens system 210 is cleaned, for example. The graph shown in FIG. 7 illustrates how the stray light effects exposure dose control, e.g., batches 26 through 29 have a lower CD by about 0.008 μm.

Embodiments of the present invention use stray light as a feedback parameter. Within the upper control limit, stray light data is fed back to the dose decision algorithm (e.g., shown in FIGS. 4 and 5) in a feedback loop. Depending on the sensitivity of stray light, products or mask layers may be shut down on the scanner or exposure tool 200 by the feedback system.

In a semiconductor device production facility, there are typically several scanners available in the fabrication facility. In accordance with embodiments of the present invention, scanners with a large amount of stray light e.g., above a predetermined threshold level, may be used to fabricate semiconductor devices that are less sensitive to stray light, while scanners with stray light measured below the threshold level are used to fabricate semiconductor devices sensitive to stray light, for example.

Advantages of embodiments of the present invention include a reduction in the number of reworks for semiconductor devices 202. The method is easily implementable in a feedback system of a specific tool 200 or in a fabrication facility, for example. The stray light information in the feedback system may be used to selectively shut down the lithography of specific semiconductor devices 202 or material layers on a particular tool 200. Scanners or exposure tools 200 with a large amount of stray light, e.g., above a predetermined threshold level, may be used to fabricate semiconductor devices 202 that are less sensitive to stray light, while scanners 200 with stray light measured below the threshold level may be used to fabricate semiconductor devices 202 sensitive to stray light, for example. One or more threshold levels of stray light may be set. The stray light may be monitored at periodic intervals, such as monthly, bimonthly, weekly, biweekly, daily, hourly, or predetermined number of minute time intervals, a predetermined number of lots of workpieces, or a lot-by-lot basis, as examples.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A lithography system, comprising:
   a lens system;
   a support proximate the lens system, the support configured to carry a semiconductor workpiece having a resist disposed thereon;
   a light source proximate the lens system, the light source configured to expose the resist on the semiconductor workpiece at an exposure dose;
   a stray light measurement device configured to measure stray light of the lithography system;
   memory configured to store a measurement of the stray light of the lithography system, a threshold level for the stray light, a resist sensitivity factor of a reference resist and a resist sensitivity factor of the resist disposed on the semiconductor workpiece; and
   a processor configured to determine a stray light dose control factor of the lithography system as a function of at least the measurement of the stray light, the sensitivity factor of the reference resist and the sensitivity factor of the resist.

2. The lithography system according to claim 1, wherein the processor is further configured to adjust the exposure dose exposing the resist of the semiconductor workpiece by the stray light dose control factor.

3. The lithography system according to claim 1, wherein the memory is further configured to store a value of an adjusted exposure dose.

4. The lithography system according to claim 1, wherein the processor is configured to determine the stray light dose control factor using equation:

$$\Delta \text{Dose} = \left\{ \begin{array}{c} SS(\text{reference resist}) * \\ \% \text{ stray light} \\ (\text{reference resist}) \end{array} \right\} * \frac{DS(\text{reference resist})}{DS(\text{resist}X)}; \quad \text{Eq.}$$

where $$DS = \frac{\Delta CD}{\Delta \text{Dose}};$$

$$SS = \frac{\Delta \text{Dose}}{\Delta\% \text{ StrayLight}};$$

wherein DS is a dose slope calculated for a material layer and the resist at a reference critical dimension (CD), "SS (reference resist)" is a stray light sensitivity of the reference resist at the reference CD, "resist X" comprises the resist disposed on the semiconductor workpiece, and "% stray light (reference resist)" comprises the stray light measured for the reference resist.

5. The lithography system according to claim 1, wherein the threshold level for stray light is 2.5% or greater.

6. A lithography system, comprising:
   a light source, the light source configured to expose a resist on a semiconductor device;
   a stray light monitoring device configured to measure stray light; and
   a control system configured to control an exposure dose of the light source, wherein the exposure dose of the light source is reduced based on a measurement of the stray light, wherein the control system is further configured to calculate a stray light dose control factor, wherein the stray light dose control factor is calculated by using Equation:

$$\Delta \text{Dose} = \left\{ \begin{array}{c} SS(\text{reference resist}) * \\ \% \text{ stray light} \\ (\text{reference resist}) \end{array} \right\} * \frac{DS(\text{reference resist})}{DS(\text{resist}X)}; \quad \text{Eq.}$$

where $$DS = \frac{\Delta CD}{\Delta \text{Dose}};$$

$$SS = \frac{\Delta \text{Dose}}{\Delta\% \text{ StrayLight}};$$

wherein DS is a dose slope calculated for a material layer and the resist at a reference critical dimension (CD), "SS (reference resist)" is a stray light sensitivity of a reference resist at the reference CD, "resist X" comprises the resist disposed on the material layer, and "% stray light (reference resist)" comprises the stray light measured for the reference resist.

7. The lithography system according to claim 6, wherein the resist comprising a resist sensitivity factor, wherein the exposure dose of the lithography system is reduced as a function of the resist sensitivity factor.

8. The lithography system according to claim 6, further comprising a memory coupled to the control system.

9. The lithography system according to claim 8, wherein the memory is configured to store a threshold level for stray light.

10. The lithography system according to claim 9, wherein the threshold level for stray light is 2.5% or greater.

11. The lithography system according to claim 9, wherein a value of the exposure dose adjusted by a dose control factor is stored in the memory.

12. The lithography system according to claim 6, further comprising a lens system proximate the light source.

13. The lithography system according to claim 12, further comprising a lithography mask arranged between the lens system and the light source.

14. A lithography system, comprising:
a light source;
a monitoring device configured to monitor stray light;
a memory configured to store a resist sensitivity factor of a resist; and
a control system configured to calculate a stray light dose control factor wherein the stray light dose control factor is calculated using equation:

$$\Delta \text{Dose} = \left\{ \begin{array}{c} SS(\text{reference resist}) * \\ \% \text{ stray light} \\ (\text{reference resist}) \end{array} \right\} * \frac{DS(\text{reference resist})}{DS(\text{resistX})}; \quad \text{Eq.}$$

where $$DS = \frac{\Delta CD}{\Delta \text{Dose}};$$

$$SS = \frac{\Delta \text{Dose}}{\Delta \% \text{ StrayLight}};$$

wherein DS is a dose slope calculated for a material layer and the resist at a reference critical dimension (CD), "SS (reference resist)" is a stray light sensitivity of a reference resist at the reference CD, "resist X" comprises the resist disposed on a workpiece, and "% stray light (reference resist)" comprises the stray light measured for the reference resist and wherein an exposure dose of the light source is reduced by the stray light dose control factor.

15. The lithography system according to claim 14, wherein a threshold level for the stray light is 2.5% or greater.

16. An apparatus for adjusting a lithography system, the apparatus comprising:
a microprocessor coupled to a memory, wherein the microprocessor is programmed to adjust the lithography system by:
measuring an amount of stray light in the lithography system;
determining a stray light dose control factor as a function of the amount of stray light;
adjusting a exposure dose by the stray light dose control factor;
discontinuing using the lithography system for a first type of semiconductor devices when a first threshold level of stray light is reached or exceeded; and
continuing using the lithography system for a second type of semiconductor devices, wherein the first type of semiconductor devices is different than the second type of semiconductor devices.

17. The apparatus according to claim 16, wherein the first threshold level of stray light is 2.5% or greater.

18. The apparatus according to claim 16, wherein the microprocessor is further programmed to adjust the lithography system by discontinuing using the lithography system for the second type of semiconductor devices when a second threshold level of stray light is reached or exceeded, the second threshold level being different than the first threshold level.

* * * * *